US008621925B2

(12) United States Patent
Dietrich et al.

(10) Patent No.: US 8,621,925 B2
(45) Date of Patent: Jan. 7, 2014

(54) DEVICE AND METHOD FOR PRODUCING A DEVICE

(75) Inventors: Volker Dietrich, Reutlingen (DE); Martin Schuerer, Aichtal (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/998,800

(22) PCT Filed: Oct. 30, 2009

(86) PCT No.: PCT/EP2009/064394
§ 371 (c)(1), (2), (4) Date: Aug. 22, 2011

(87) PCT Pub. No.: WO2010/072455
PCT Pub. Date: Jul. 1, 2010

(65) Prior Publication Data

US 2011/0290016 A1 Dec. 1, 2011

(30) Foreign Application Priority Data

Dec. 16, 2008 (DE) ......................... 10 2008 054 743

(51) Int. Cl.
*G01D 11/24* (2006.01)
*G01L 19/14* (2006.01)

(52) U.S. Cl.
USPC ............................................................ 73/431

(58) Field of Classification Search
USPC .................................................... 73/431, 426
See application file for complete search history.

(56) References Cited

U.S. PATENT DOCUMENTS

| | | | | |
|---|---|---|---|---|
| 5,059,746 | A | 10/1991 | Hayes et al. | |
| 5,462,622 | A * | 10/1995 | Small et al. | 156/245 |
| 5,926,952 | A * | 7/1999 | Ito | 29/883 |
| 6,300,169 | B1 | 10/2001 | Weiblen et al. | |
| 7,380,458 | B1 | 6/2008 | Date et al. | |
| 7,905,131 | B2 * | 3/2011 | Watanabe et al. | 73/40 |
| 8,049,290 | B2 * | 11/2011 | Raben | 257/433 |
| 2006/0061010 | A1 * | 3/2006 | Huonker | 264/272.11 |
| 2007/0044558 | A1 * | 3/2007 | Ohta | 73/493 |
| 2009/0097222 | A1 * | 4/2009 | Babutzka et al. | 361/812 |
| 2011/0174071 | A1 * | 7/2011 | Ludwig | 73/431 |
| 2012/0009816 | A1 * | 1/2012 | Hiraoka et al. | 439/488 |

FOREIGN PATENT DOCUMENTS

| | | | | |
|---|---|---|---|---|
| CN | 1897288 | | 1/2007 | |
| DE | 10 2004 044 614 | | 3/2006 | |
| DE | 10 2005 040 781 | | 3/2007 | |
| DE | 10 2006 040 564 | | 3/2007 | |
| DE | 102008040155 | A1 * | 1/2010 | G01D 11/24 |
| EP | 1634687 | A1 * | 3/2006 | |
| EP | 2 090 873 | | 8/2009 | |
| EP | 2090873 | A1 * | 8/2009 | G01L 9/00 |
| JP | 7-294353 | | 11/1995 | |
| JP | 2001-50838 | | 2/2001 | |
| JP | 2010-21225 | | 1/2010 | |
| WO | WO 02/079743 | | 10/2002 | |
| WO | WO 2006/000212 | | 1/2006 | |
| WO | WO 2006000212 | A1 * | 1/2006 | H01L 23/10 |

* cited by examiner

*Primary Examiner* — Lisa Caputo
*Assistant Examiner* — Jamel Williams
(74) *Attorney, Agent, or Firm* — Kenyon & Kenyon LLP

(57) ABSTRACT

A sensor device has a structural element, a carrier element and a housing, the structural element being situated on the carrier element, and the structural element and the carrier element being situated at least partially within the housing. The sensor device also has an intermediate housing, which is situated essentially between the housing and the structural element, the intermediate housing including a premold housing.

8 Claims, 4 Drawing Sheets

DEVICE AND METHOD FOR PRODUCING A DEVICE

BACKGROUND OF THE INVENTION

1. Field of the Invention The present invention relates to a sensor device.

2. Description of Related Art

Such sensor devices are generally known. From published German patent application document DE 10 2005 040 781 A1, for example, a sensor device is known which has a molded housing having a micromechanical sensor element and a carrier element, the sensor element being situated in a hollow space in the molded housing and on the carrier element, the carrier element being completely situated in the molded housing and the evaluation element being decoupled from the molded housing by a passivating gel.

BRIEF SUMMARY OF THE INVENTION

The device according to the present invention and the method according to the present invention have the advantage over the related art that the structural element is protected by the intermediate housing during the production of the housing, and consequently, damage to the structural element is prevented during the molding process. This is particularly necessary in the development of the structural element as sensor element, and preferably as pressure sensor element, since in this case the danger of damage of the structural element and preferably of pressure-sensitive areas (diaphragms) of the pressure sensor element is comparatively high because of the injection pressure and/or the high temperatures during the molding process. An effective protection is achieved in that the intermediate housing is developed as a premold housing, and is consequently already cured at the accommodation of the structural element and at the production of the housing. Furthermore, the intermediate housing makes possible an improved positioning of the device in the production process of the housing, since, based on the rigid intermediate housing, a firm clamping of the device into an injection molding tool is made possible for producing the housing. In addition, the structural element is decoupled from the housing, so that no thermal stresses of the housing are transmitted to the structural element, but are absorbed by the intermediate housing. This is of advantage especially in the production process of the housing, since damage to the structural element by mechanical stress during the curing of the molding compound is prevented. A further advantage is that influence on the injection molding quality occurs, during production of the housing, via the shaping of the intermediate housing. For instance, if the intermediate housing is developed to be spherical, a housing having fewer weld lines may be implemented. The housing is comparatively flexibly developed in the molding process, so that a variable adaptation of the housing is made possible in a simple way with respect to the application of the device.

According to one preferred refinement, it is provided that the structural element be completely enclosed by the intermediate housing and/or that the carrier element be partially enclosed by the intermediate housing, so that, in an advantageous manner, the structural element is completely protected by the intermediate housing against outer influences, and at the same time electrical contacting of the structural element is made possible via the carrier element from outside the housing. The intermediate housing and/or the housing is formed in an outer region of the carrier element, preferably as a socket, so that the carrier element includes the plug contacts in this outer region, and thus comparatively simple contacting of the carrier element may be implemented by a simple plug contact. The carrier element particularly includes a leadframe or a metallic insertion part (MIP).

According to one additional refinement, it is provided that the intermediate housing include a first housing region and a second housing region, the first and the second housing region preferably being provided to be adhered to each other, welded to each other and/or latched into each other. Especially advantageously, the first and the second housing regions include two half shells which together form the intermediate housing. Thus it is particularly advantageous to position the structural element and the carrier element in the intermediate housing in a simple manner.

According to a further preferred refinement, it is provided that between the structural element and the intermediate housing, between the carrier element and the intermediate housing and/or between the housing and the intermediate housing decoupling means be situated. The decoupling means include particularly an elastomer. Consequently, the housing is advantageously decoupled from the structural element, so that mechanical influences on the housing, such as impacts and the like, are not transmitted to the structural element, or only negligibly so. The decoupling means are also used preferably for passivating the structural element.

According to a further preferred refinement, it is provided that the intermediate housing and/or the housing have an inlet channel. In the case in which the structural element includes a sensor element, the inlet channel is advantageously used to conduct a measuring medium to the sensor element through the housing and through the intermediate housing. The inlet channel is preferably sealed from the intermediate housing and/or from the housing.

According to yet another preferred refinement, it is provided that the structural element include a pressure sensor that is connected to a pressure medium via the inlet channel, so that, in an advantageous manner, an outer pressure is conducted to a pressure-sensitive region of the pressure sensor.

One more subject matter of the present invention is a method for producing a device, in a first method step the structural element being positioned together with the carrier element in the intermediate housing and in a second method step the intermediate housing being injection molded around using a molding compound to produce the housing. Because of the situation of the structural element, and at least partially of the carrier element, inside the intermediate housing, protection of the structural element is particularly advantageously achieved during the second method step (as was stated in detail above), so that damage of the structural element by the injection pressure during injection of the molding compound, by an increase in temperature during the molding process and/or by thermal stresses during the curing of the molding compound after the molding process, is advantageously avoided, and a variable and cost-effective development of the housing is achievable by using a molding process. Moreover, decoupling of the structural element from the housing is achieved by having the intermediate housing.

According to still another refinement, it is provided that, in a first method step, the structural element is first situated, together with the carrier element, in a first housing region and then the second housing region is fastened on the first housing region, so that advantageously the structural element is able to be positioned comparatively simply and cost-effectively in the intermediate housing that is developed as the premold housing. By the subsequent adhesion, latching and/or welding of the first and second housing regions, especially using laser transmission welding or ultrasound welding, a mechanically firm and tight connection is achieved between the first and the second housing region to form the intermediate housing.

According to one more preferred refinement, it is provided that, in a third method step, time-wise before the first method step, the carrier element is produced by a stamping method in a grid, the structural element being subsequently positioned on the carrier element of the grid, and in a fourth method step, time-wise after the first method step, the carrier element is cut apart from the grid. Consequently, the device is especially advantageously and particularly cost-effectively producible in comparatively large piece numbers.

DETAILED DESCRIPTION OF THE INVENTION

Figure 1A:
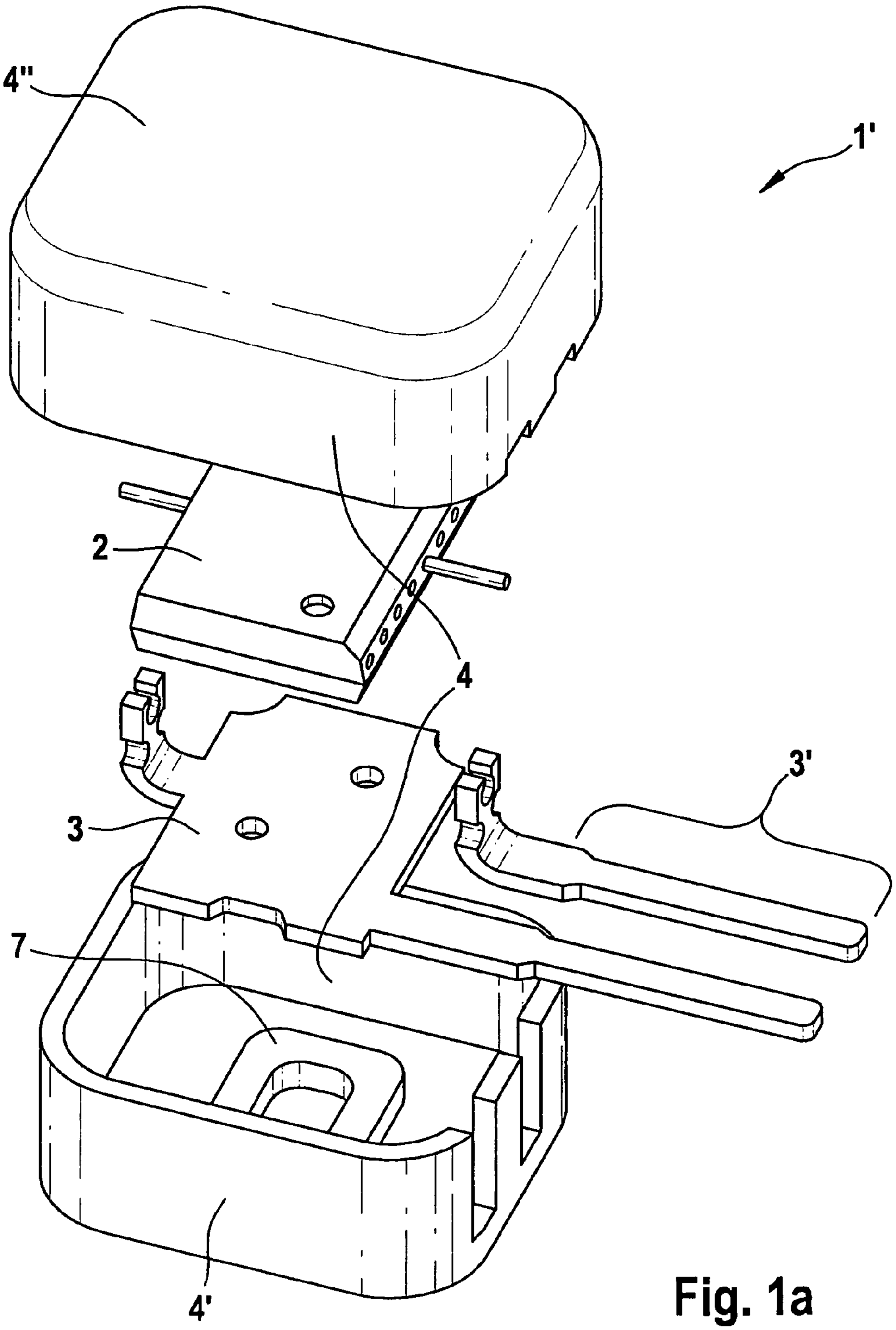
FIGS. 1*a* and 1*b* show a first precursor structure for producing a device according to a first specific embodiment of the present invention and a device according to the first specific embodiment of the present invention.
Figure 1B:
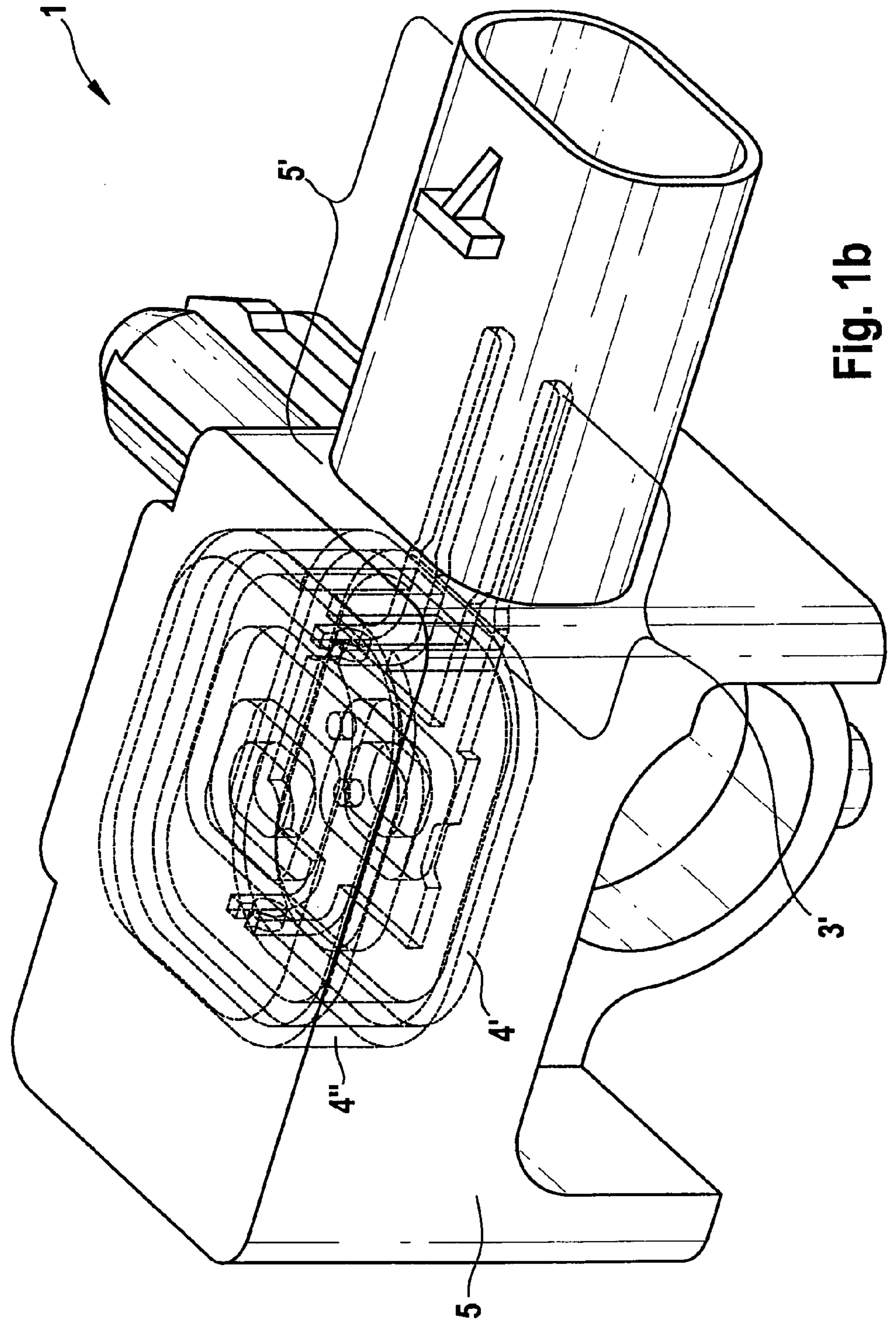

FIGS. 1*a* and 1*b* show a first precursor structure 1' for producing a device 1 according to a first specific embodiment of the present invention, and a device 1 according to the first specific embodiment of the present invention, a first and a third method step being illustrated schematically with the aid of a first precursor structure 1' shown in FIG. 1*a*. In the third method step, a structural element 2, which includes a sensor element, is positioned on a carrier element 3. Carrier element 3 especially includes a leadframe, which is produced in a stamping process. In a subsequent first method step, structural element 2 and at least partially carrier element 3 are positioned in a first housing region 4' of an intermediate housing 4, a second housing region 4" of intermediate housing 4 being subsequently situated on first housing region 4'. First and second housing region 4', 4" are welded, adhered and/or clipped to each other, in particular, carrier element 3 being preferably clamped in by housing regions 4', 4". Structural element 2 is completely enclosed by intermediate housing 4, and is able to be electrically contacted via carrier element 3 from outside intermediate housing 4. Carrier element 3, on the other hand, has an outer region 3', that projects from intermediate housing 4. In a second method step, first precursor structure 1' is injection molded using a molding compound, to form housing 5, intermediate housing 4 being surrounded essentially completely by housing 5 and structural element 2 being completely insulated and decoupled because of intermediate housing 4 by the molding compound. In the area of first housing region 4' there is also situated a decoupling means 7, which acts to decouple structural element 2 from intermediate housing 4. Alternatively, decoupling means 7 includes passivating means, so that preferably carrier element 3 is passivated by the decoupling means when there is direct contact between a measuring medium and a sensitive region of structural element 2, and/or the sensitive region is damped with respect to an excessive mechanical stress.

FIG. 1*b* shows device 1 according to the first specific embodiment, in the area of outer region 3', housing 5 has the shape of a plug housing, so that outer region 3' of carrier element 3 forms plug contacts, and carrier element 3 is able to be contacted by a simple plug contact.

Figure 2A:
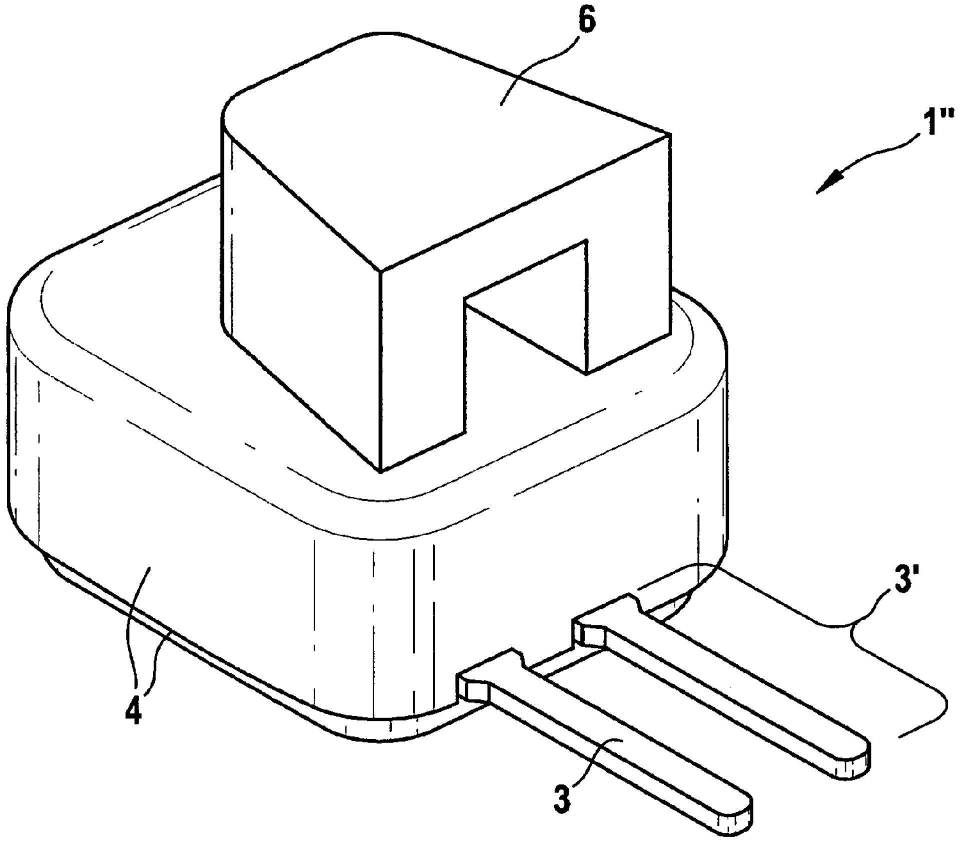
FIGS. 2*a* and 2*b* show a second precursor structure for producing a device according to a second specific embodiment of the present invention and a device according to the second specific embodiment of the present invention.
Figure 2B:
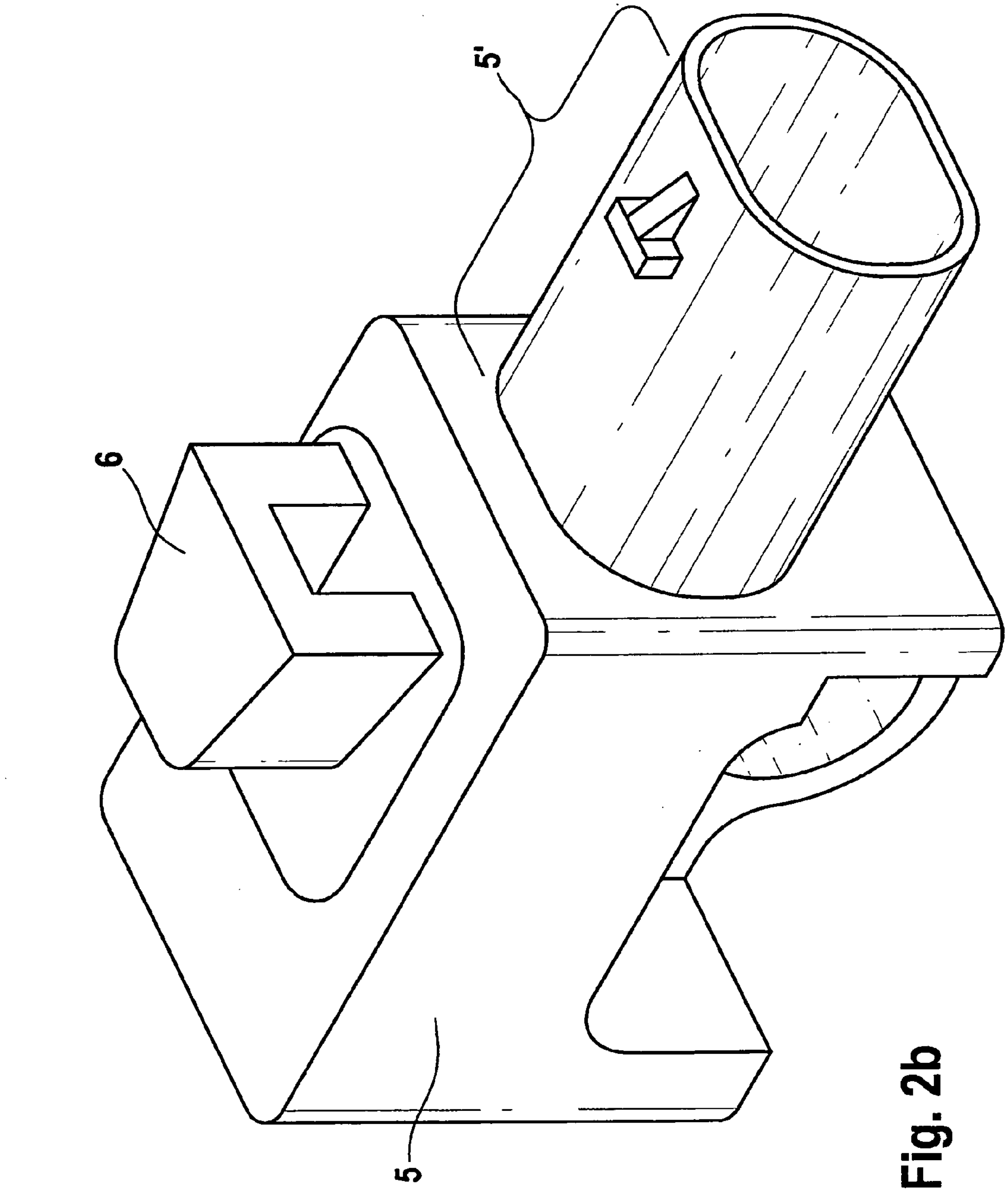

FIGS. 2*a* and 2*b* show a second precursor structure 1" for producing a device 1 according to a second specific embodiment of the present invention and a device 1 according to the second specific embodiment of the present invention, second precursor structure 1" shown in FIG. 2*a* being essentially identical to first precursor structure 1' shown in FIG. 1*a*, and device 1 shown in FIG. 2*b* according to the second specific embodiment being essentially identical to device 1 according to the first specific embodiment shown in FIG. 1*b*, intermediate housing 4 having an inlet channel 6 which projects from housing 5, and leads a pressure medium to a pressure-sensitive region of structural element 2. Consequently, structural element 2 functions as a pressure sensor element for measuring pressure in a pressure medium.

What is claimed is:

1. A sensor device, comprising:
- a carrier element;
- a structural element situated on the carrier element;
- a housing, wherein the structural element and the carrier element are situated at least partially within the housing, and wherein the housing is a molded housing; and
- an intermediate housing situated essentially between the housing and the structural element, wherein the intermediate housing is a premold housing defining an enclosed cavity in which the structural element is situated;
- wherein the intermediate housing includes a first housing region and a second housing region configured to be connected to each other.

2. The device as recited in claim 1, wherein at least one of (i) the structural element is completely enclosed by the intermediate housing, and (ii) the carrier element is enclosed partially by the intermediate housing.

3. The device as recited in claim 1, further comprising:
- a decoupling arrangement situated at least one of (i) between the structural element and the intermediate housing, (ii) between the carrier element and the intermediate housing, and (iii) between the housing and the intermediate housing.

4. The device as recited in claim 3, wherein at least one of the intermediate housing and the housing has an inlet channel.

5. The device as recited in claim 4, wherein the structural element includes a pressure sensor connected to a pressure medium via the inlet channel.

6. A method for producing a sensor device, comprising:
- positioning a structural element together with a carrier element in an enclosed cavity of an intermediate housing; and
- injection molding, using a molding compound, a further housing around the intermediate housing;
- wherein the intermediate housing includes a first housing region and a second housing region configured to be connected to each other.

7. The method as recited in claim 6, wherein the structural element is first positioned in the first housing region together with the carrier element, and then the second housing region is fastened on the first housing region.

8. The method as recited in claim 7, wherein the carrier element is first produced in a grid by a stamping method, and the structural element is subsequently positioned on the carrier element of the grid, and after positioning the structural element together with the carrier element in the intermediate housing, the carrier element is cut apart from the grid.

* * * * *

UNITED STATES PATENT AND TRADEMARK OFFICE

CERTIFICATE OF CORRECTION

PATENT NO. : 8,621,925 B2
APPLICATION NO. : 12/998800
DATED : January 7, 2014
INVENTOR(S) : Dietrich et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 49 days.

Signed and Sealed this
Twenty-second Day of September, 2015

Michelle K. Lee
*Director of the United States Patent and Trademark Office*